(12) United States Patent
Holyoake et al.

(10) Patent No.: US 11,439,047 B2
(45) Date of Patent: Sep. 6, 2022

(54) SERVER RACKS FOR HOT AISLE—COLD AISLE SERVER ROOMS

(71) Applicant: INTERNATIONAL BUSINESS MACHINES CORPORATION, Armonk, NY (US)

(72) Inventors: Colin Ian Holyoake, Braishfield (GB); Maurice Francis Gray, Hampshire (GB); Michael James Bettle-Shaffer, Hampshire (GB)

(73) Assignee: International Business Machines Corporation, Armonk, NY (US)

( * ) Notice: Subject to any disclaimer, the term of this patent is extended or adjusted under 35 U.S.C. 154(b) by 408 days.

(21) Appl. No.: 16/668,000

(22) Filed: Oct. 30, 2019

(65) Prior Publication Data

US 2021/0136959 A1    May 6, 2021

(51) Int. Cl.
*H05K 7/00*        (2006.01)
*H05K 7/20*        (2006.01)
(Continued)

(52) U.S. Cl.
CPC ....... *H05K 7/20836* (2013.01); *G05B 13/041* (2013.01); *H05K 7/1488* (2013.01); *H05K 7/20745* (2013.01); *H05K 7/1498* (2013.01)

(58) Field of Classification Search
CPC ............ H05K 7/20836; H05K 7/1488; H05K 7/2045; H05K 7/1498; G05B 13/041; G08B 21/18; G05D 23/1917; G05F 1/206; G05F 1/3203; G05F 1/324; Y02D 10/126; Y10S 439/928

USPC ..... 312/223.1, 265.1–265.4; 340/686.1, 540, 340/545.6, 500, 691.1; 361/727, 721; 211/26

See application file for complete search history.

(56) References Cited

U.S. PATENT DOCUMENTS

| | | | |
|---|---|---|---|
| 7,043,647 B2 * | 5/2006 | Hansen | G06F 1/26 713/340 |
| 7,350,715 B2 * | 4/2008 | Pradhan | G01S 13/74 235/383 |

(Continued)

FOREIGN PATENT DOCUMENTS

| | | | |
|---|---|---|---|
| CN | 102313506 | * | 12/2013 |
| CN | 104053321 | * | 9/2014 |

OTHER PUBLICATIONS

Moss et al., "Rack Blanking Panels—To Fill or Not to Fill", A Dell Technical White Paper, 2011, pp. 1-9.

*Primary Examiner* — Janet M Wilkens
(74) *Attorney, Agent, or Firm* — Kristofer L. Haggerty

(57) ABSTRACT

A standard server rack is modified to be able to detect if a blanking panel is missing from an unoccupied slot. Detection can be achieved electrically by providing switch elements in the holes on the rack siderails, whose switching state depends on whether a fastening pin is in the hole. A blanking panel, when fitted to a particular slot, thus switches the switch elements for that slot, which can be detected by a make/break circuit including the switch elements. Alternatively, detection of a missing blanking panel can be achieved optically by arranging a bank of forward pointing optical sensors at the back of the server rack, which point forward to detect the presence of a blanking panel. The optical sensors are distributed vertically so that at least one optical sensor covers each slot.

3 Claims, 7 Drawing Sheets

(51) Int. Cl.
  *G05B 13/04*    (2006.01)
  *H05K 7/14*    (2006.01)

(56) References Cited

U.S. PATENT DOCUMENTS

| | | | | |
|---|---|---|---|---|
| 7,857,214 | B2* | 12/2010 | Saliaris | H05K 7/1498 |
| | | | | 235/383 |
| 8,825,451 | B2 | 9/2014 | Vangilder | |
| 8,892,389 | B1 | 11/2014 | Muller | |
| 8,917,164 | B2* | 12/2014 | Frohlich | H02B 11/02 |
| | | | | 700/291 |
| 9,418,256 | B2* | 8/2016 | Nordin | H01Q 3/24 |
| 10,101,178 | B2* | 10/2018 | Dias | G01D 5/16 |
| 10,242,546 | B1* | 3/2019 | Wright | H05K 7/1497 |
| 2008/0265722 | A1* | 10/2008 | Saliaris | G06F 1/183 |
| | | | | 312/223.1 |
| 2011/0187503 | A1* | 8/2011 | Costa | H05K 7/1498 |
| | | | | 340/8.1 |
| 2012/0019115 | A1* | 1/2012 | Dunwoody | H05K 7/1497 |
| | | | | 62/529 |
| 2012/0091090 | A1* | 4/2012 | Larsen | H02G 3/0418 |
| | | | | 211/183 |
| 2012/0166693 | A1* | 6/2012 | Weinstock | G06Q 10/087 |
| | | | | 340/687 |
| 2014/0292167 | A1* | 10/2014 | Sojka | H05K 7/186 |
| | | | | 312/223.1 |
| 2015/0193320 | A1* | 7/2015 | Yu | G06F 11/3089 |
| | | | | 702/182 |
| 2016/0234972 | A1 | 8/2016 | Billet | |
| 2018/0205607 | A1 | 7/2018 | Palmer | |

\* cited by examiner

SERVER RACKS FOR HOT AISLE—COLD AISLE SERVER ROOMS

BACKGROUND

The present disclosure relates to rack systems for server rooms with a hot aisle—cold aisle layout.

Servers may often have both power and cooling requirements due to the heat generated by computers as a biproduct of operation, sometimes referred to as server heat load. Such heat generation may inhibit or disable server operation, and therefore approaches are taken to reduce heat accumulation through designs such as hot aisle/cold aisle layouts where server racks are arranged side-by-side into multiple rows and are separated by aisles that alternate between hot aisles and cold aisles. Namely, an A/C system is configured to circulate cold air, typically supplied through a pressurized raised underfloor of the server room, through a row of server racks from a cold aisle to a hot aisle and to extract the hot air that has passed through the row of server racks. The hot air is extracted from the hot aisles through exhaust conduits, usually in the ceiling void. The extracted hot air is then supplied to a cooling unit where it is cooled ready for recirculation.

SUMMARY

The present disclosure is based on a standard server rack having a front and a back. A standard server rack comprises a frame that defines a plurality of vertically adjacent slots of standard height and standard width for receiving and accommodating standard-sized rack units. Each rack unit has the standard width and a height equal to an integer multiple of the standard height. The frame has left and right siderails on its front which extend vertically and in which are arranged respective series of holes by which a rack unit accommodated in a slot may be secured to the frame with suitable fastening pins.

In one group of embodiments, the server rack is modified by additionally providing respective switch elements associated with the holes of at least one of the left and right siderails, each switch element being configured to toggle between first and second switching states dependent on the presence or absence of a fastening pin in its hole. There are various options for implementing the switch elements. In some embodiments, the server rack further comprises an electrical power supply operable to generate a low voltage and the switch elements are electrically connected to the power supply so that the server rack is operable to detect presence and slot locations of fastening pins in its holes. The low voltage may be a DC voltage with a voltage difference of at most 25V, e.g. ±5V, ±12V, +5V and ground, +/−12V and ground, or +/−20V and ground. In some embodiments, the switch elements can be purely electrical, e.g. reed switches. In some embodiments, the switch elements can be optoelectronic, each comprising a light source and a light detector, where the first and second switching states correspond to light from the light source being received or not received by the light detector responsive to the presence or absence of a fastening pin in the hole.

The frame is configured in some embodiments to form part of a continuity circuit, wherein closing of the continuity circuit to make a connection indicative of the presence of a blanking panel requires an electrically conductive path to be externally provided by the blanking panel to bridge between selected pairs or larger groups of holes. For example, to "make" the circuit, the frame may be designed so that a blanking panel has to form an electrically conductive path: horizontally between two holes at the same height in the left and right siderails; vertically between two holes at different heights in the same siderail; horizontally between two pairs of holes each pair at the same height in the left and right siderails; vertically between two holes at different heights in each of the left and right siderails; and/or in a loop connecting at least three holes including at least one hole from both left and right siderails, for example a rectangular loop connecting four holes arranged at the four corners of the rectangle.

As well as an adapted server rack with switch elements in the siderail holes, this group of embodiments may also provide an adapted blanking panel for use with the adapted server rack. The blanking panel comprises a panel sheet; left and right side fastening pin locations in the panel sheet that are spaced apart horizontally by a distance that permits attachment to holes in left and right server rack rails of a server rack; and at least one electrically conductive path between at least two of the pin locations.

The blanking panel may be formed with fastening pins upstanding from the panel sheet at the fastening pin locations, where these fastening pins may be formed integrally with the blanking panel or may be separate components that are attached to the blanking panel. Alternatively, the blanking panel may have apertures formed in the panel sheet at the fastening pin locations for receiving fastening pins, so that the blanking panel can be secured to a server rack using separate fastening pins.

In another group of embodiments, instead of providing switch elements for the rack siderail holes, sensing of the presence (or absence) of a blanking panel is provided by a bank of optical sensors, which may conveniently be arranged to the rear of the server rack. The optical sensors may be arranged to look forward to detect the presence of a blanking panel. A standard server rack is thus modified by additionally providing an optical sensor bank comprising a plurality of optical sensors distributed vertically so that there is at least one optical sensor per slot, each optical sensor being operable to detect presence of a body at or adjacent to the front of the server rack, thereby to detect if a blanking panel is fitted to the front of the server rack of any particular slot.

In some embodiments, the optical sensors are further operable to detect presence of a body at, or adjacent to, the back of the server rack, thereby to detect if a rack unit is fitted in any particular slot. In some embodiments, the optical sensors are further operable to detect absence of a body at, or adjacent to, the front and the back of the server rack, thereby to detect if a slot is empty and not blanked off on the front.

The optical sensor bank may be mounted in the rear access door so as to be correctly aligned for normal operation when the access door is in a closed position. For example, if the rear access door is mounted to the server rack with a vertical hinge on the left or right side, then the optical sensors will 'point' into space at some angle when the door is open but point forwards when the door is closed. Alternatively, the optical sensor bank could be fixed to a part of the rack frame, rather than on the rear door.

As well as a server rack with such a rear access door, the disclosure also relates to such a rear access door suitable for attaching to a server rack.

We therefore provide a number of solutions to enable a server rack to detect and raise an alert whenever blanking panels are missing.

BRIEF DESCRIPTION OF THE DRAWINGS

In the following, the present invention will further be described by way of example only with reference to exemplary embodiments illustrated in the figures.

DETAILED DESCRIPTION OF THE DRAWINGS

In the following detailed description, for purposes of explanation and not limitation, specific details are set forth in order to provide a better understanding of the present disclosure. It will be apparent to one skilled in the art that the present disclosure may be practiced in other embodiments that depart from these specific details.

Figure 1:
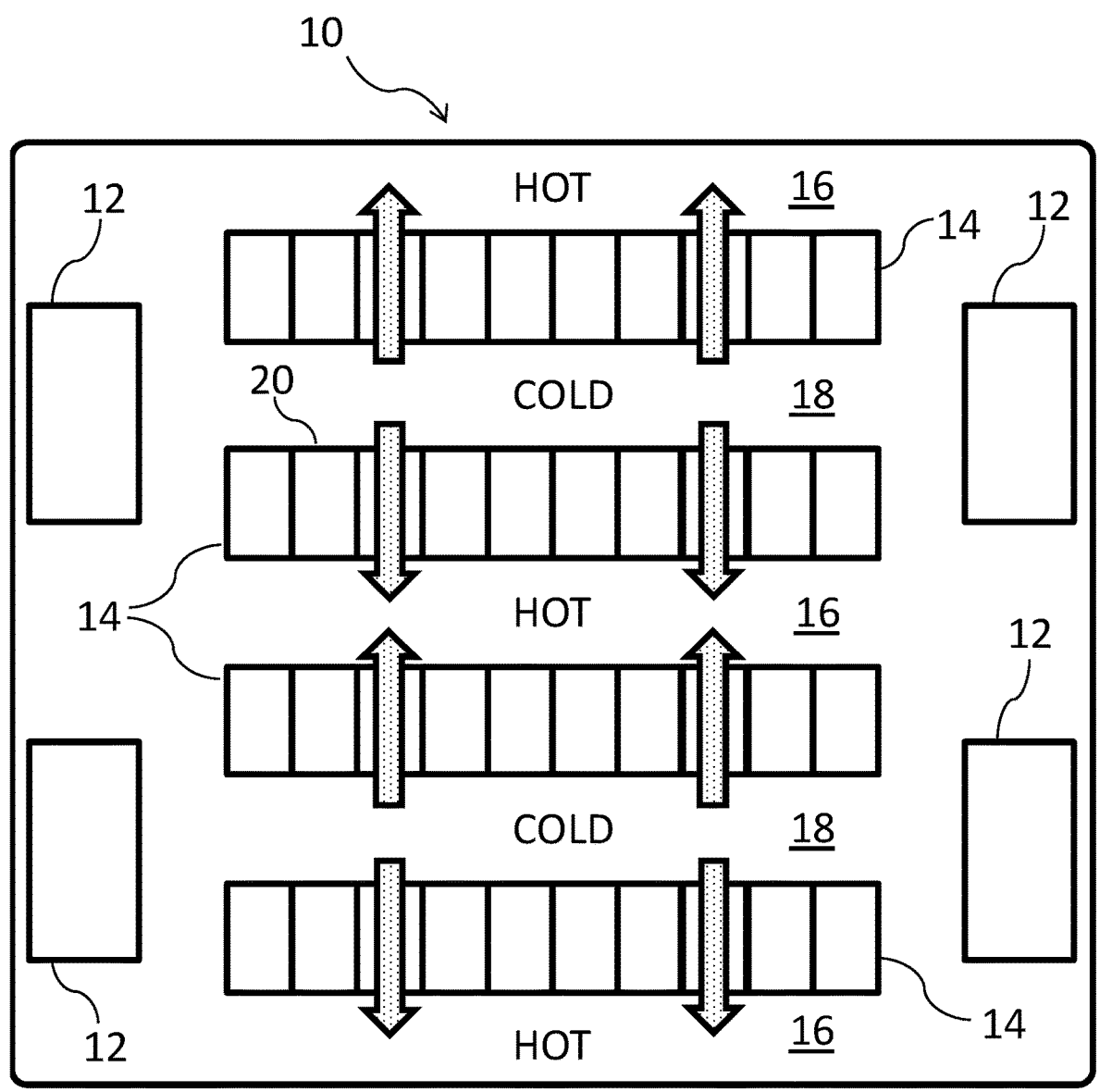
FIG. 1 is a schematic plan view of a server room with a hot aisle—cold aisle layout.

FIG. 1 is a schematic plan view of a server room 10 of a datacenter that follows a common architectural design called a hot aisle/cold aisle layout. Multiple racks 20 are arranged side-by-side into multiple rows 14. The rows 14 are separated by aisles 16, 18. The aisles alternate between hot aisles 16 and cold aisles 18 as defined by the cooling airflow provided by the air conditioning (A/C) system which is directed through adjacent rows of racks in alternating directions. Namely, the A/C system is configured to circulate cold air, typically supplied through a pressurized raised underfloor of the server room, through a row of server racks from a cold aisle to a hot aisle and to extract the hot air that has passed through the row of server racks. The hot air is extracted from the hot aisles through exhaust conduits, usually in the ceiling void. The extracted hot air is then supplied to a cooling unit 12 where it is cooled ready for recirculation. The cooling units are usually called HVAC units, where HVAC stands for heating, ventilation, and air conditioning. An HVAC unit 12 is typically located at both ends of each row. The HVAC units 12 usually extend from floor to ceiling and have intakes at ceiling level for receiving the hot air extracted from the hot aisles and outlets into the underfloor for passing the cooled air back through the underfloor to a cold aisle.

Figure 2B:
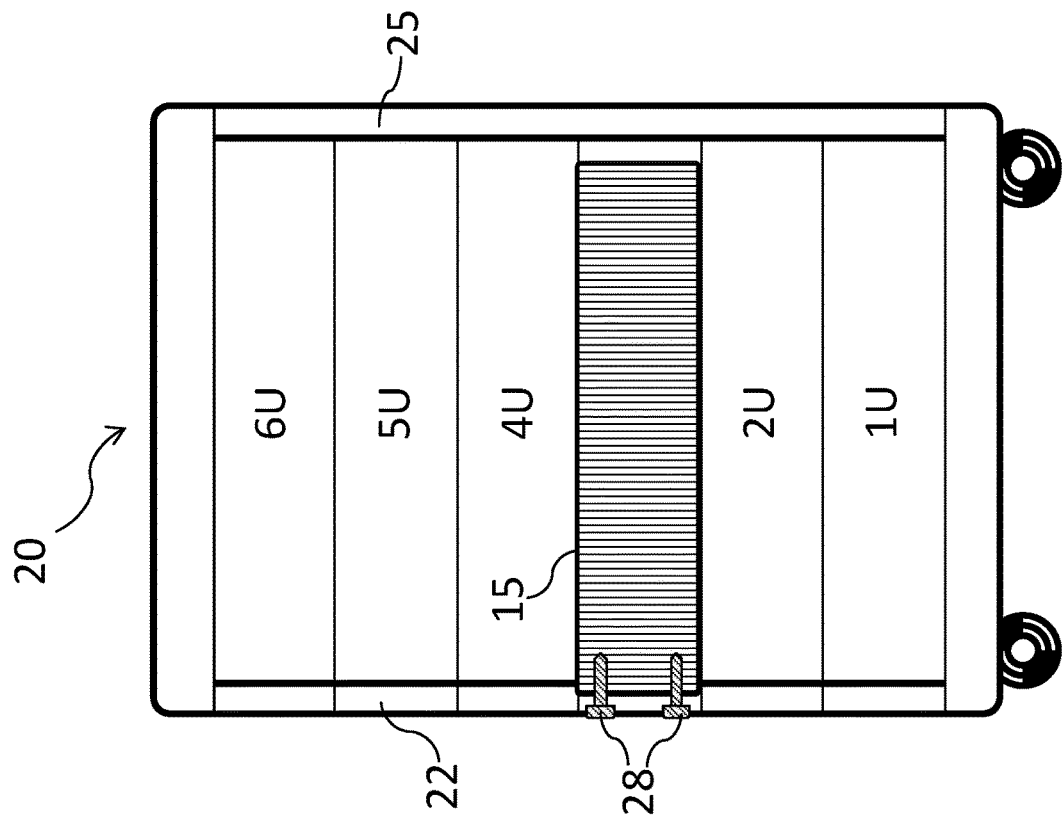
FIGS. 2A and 2B are schematic front and side views of a server rack with one slot occupied by a rack unit and five empty slots.
Figure 2A:
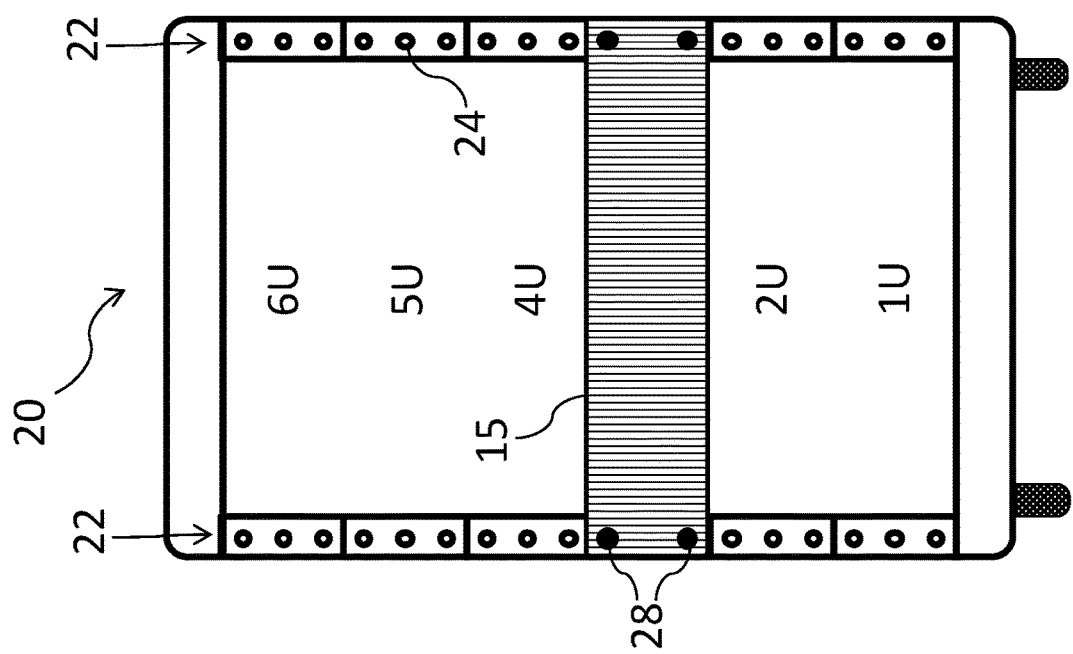

FIGS. 2A and 2B are schematic front and side views of a server rack 20. The term rack refers to a standard format housing for accommodating electrically powered devices. Each rack has multiple slots for accommodating electrically powered devices of standard housing dimensions, referred to as rack units. One rack unit 15 is shown schematically in the rack 20. Rack units 15 may be, for example, servers such as storage area networks (SANs), network switches and power supplies. A rack unit 15 is secured into a slot or group of neighboring slots by fastening with fasteners 28 to holes 24 in a pair of siderails 22 which extend vertically either side, i.e. to the left and right, of the rack frame. The holes 24, or other suitable fastener receiving features, referred to as U-holes in the following, are spaced equal distances apart in the vertical direction to allow a rack unit 15 to be bolted or otherwise releasably secured to a desired slot of the rack 20. Typically, there are three U-holes 24 on each siderail 22 per slot as schematically illustrated. The rack 20 also has a rear access door 25 fastened with hinges to the rear of the rack 20, so that for example electrical connections on the back of the rack units can be configured. Common rack unit width dimensions are 19 inch and 23 inch and height dimensions 1.75 inch. Rack unit dimensions are standardized by the Electronic Components Industry Association. Racks are supplied with different heights corresponding to the number of slots, with slot numbers of between six and forty-two being the norm. It is a usual that the server slots are labelled from bottom to top with a unit index, U, as U1, U2, U3 etc. Each "U" spans three U-holes aligned vertically on either side of the rack, i.e. six U-holes in total, via which a rack unit or a blanking panel may be secured with corresponding screws or other threaded fasteners. The U-holes are either square or circular depending on the manufacturer. Devices are dimensioned in height in multiples of the slot height to fit into the corresponding number of slots, and are referred to as 1U, 2U etc. devices.

Figure 3B:
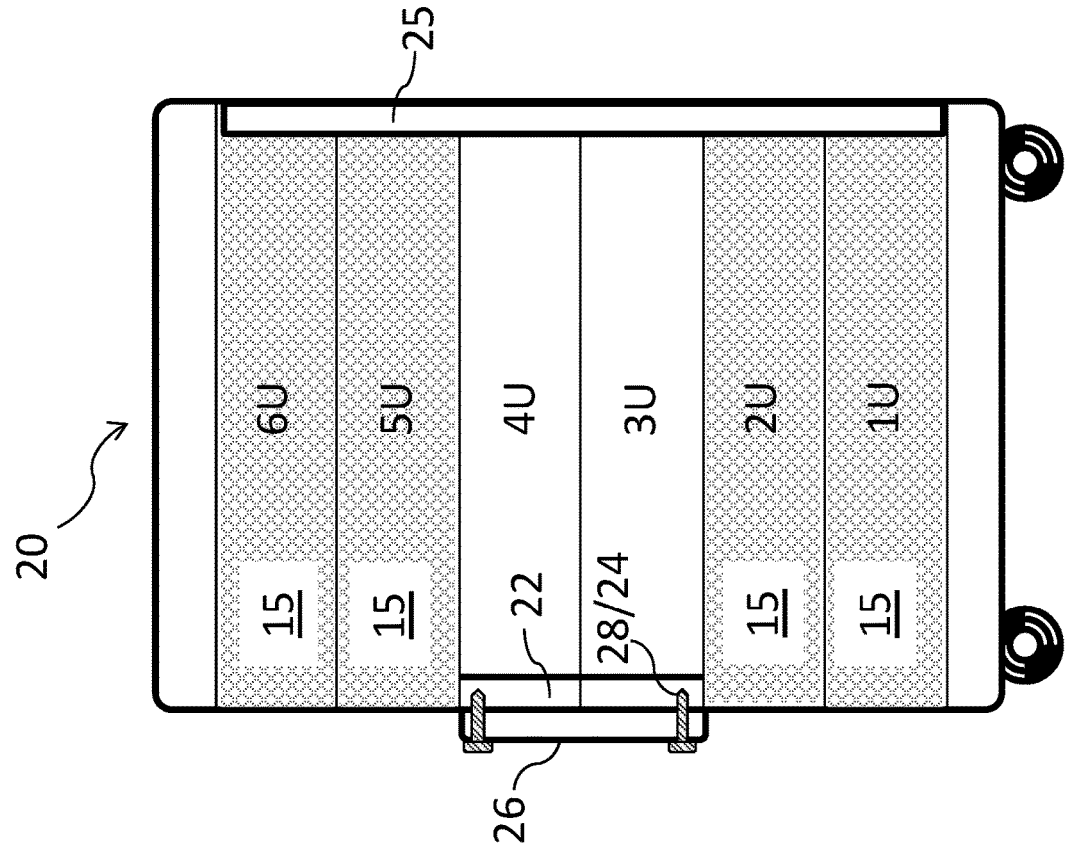
FIGS. 3A and 3B are schematic front and side views of the same server rack as FIGS. 2A and 2B with four filled slots and two empty slots, the empty slots being blanked off with a blanking panel.
Figure 3A:
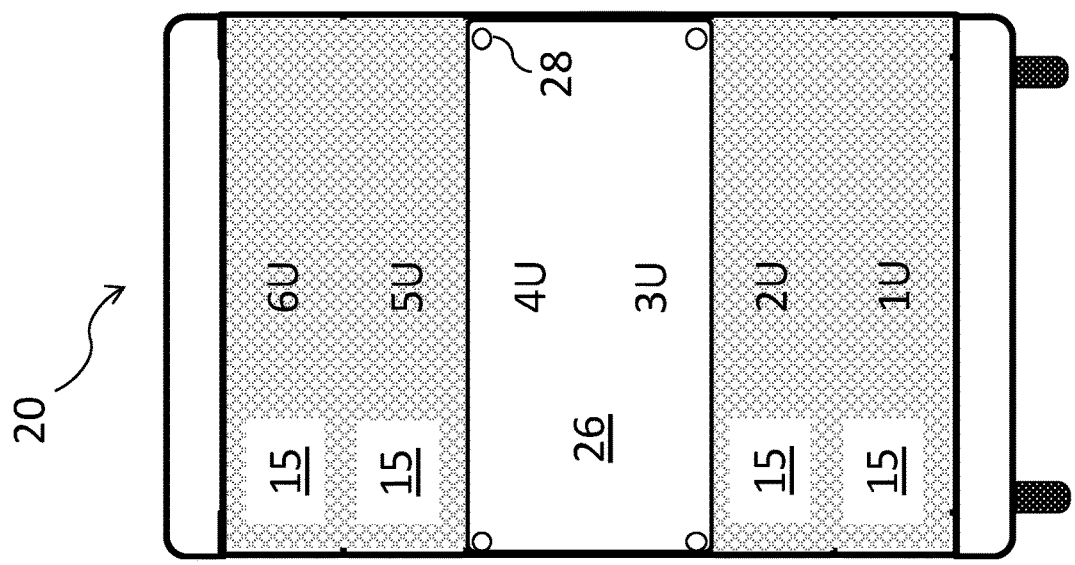

FIGS. 3A and 3B are schematic front and side views of a partially populated server rack 20. We use the same reference numerals as in FIGS. 2A and 2B. We show a partially populated server rack, since this is representative of the fact that it is common for a rack not to be fully populated. Consequently, there are some empty slots. For efficient one-way circulation of air through a rack from the cold aisle to the hot aisle, it is important to close off the gaps of empty slots with blanking panels. Blanking panels of different size are available for blanking off different numbers of U's, e.g. 1U, 2U, 3U or 6U. The blanking panels block and seal the front of the server rack from the rear of the rack, so that cold air flow is channelled to pass only through occupied slots. In FIGS. 3A and 3B, we show by way of example racks 1U, 2U, 5U and 6U occupied with rack units 15—as indicated by the cross-hatching—and a gap at racks 3U and 4U which is blocked with a suitable 2U-sized blanking panel 26 secured at each corner with a fastener 28 in a matching U-hole 24.

Figure 4:
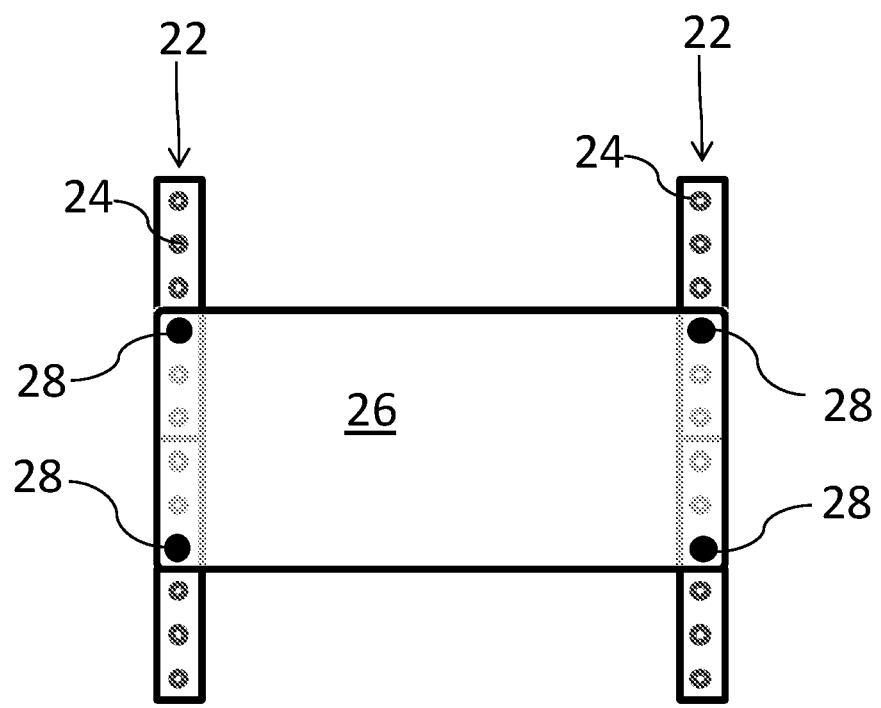
FIG. 4 is a more detailed partial front view of FIG. 3A.

FIG. 4 shows the fitted blanking panel 26 of FIGS. 3A and 3B in more detail with another schematic front view in which the U-holes 24 on the rack siderails 22 that are not used for securing the blanking panel 26 with the fasteners 28 are also shown.

Without blanking panels, hot air from the hot aisle side recirculates into the cold aisle side, which reduces the amount of cooling. The reduction in cooling caused by the absence of blanking panels also has a knock-on effect on the servers, since the server cooling fans will then need to work harder, which in turn creates more heat. Nevertheless, it is often the case that blanking panels are not installed. This may be due to technicians not complying with protocol, or the lack of availability of a stock of blanking panels, e.g. because there is no storage facility in the server room. It is calculated that one missing panel of 1U size can result in circulation loss of 9 liters of air per second. This is an important problem, since cooling cost is one of the biggest, if not the biggest, cost component of operating a datacenter.

Figure 5:
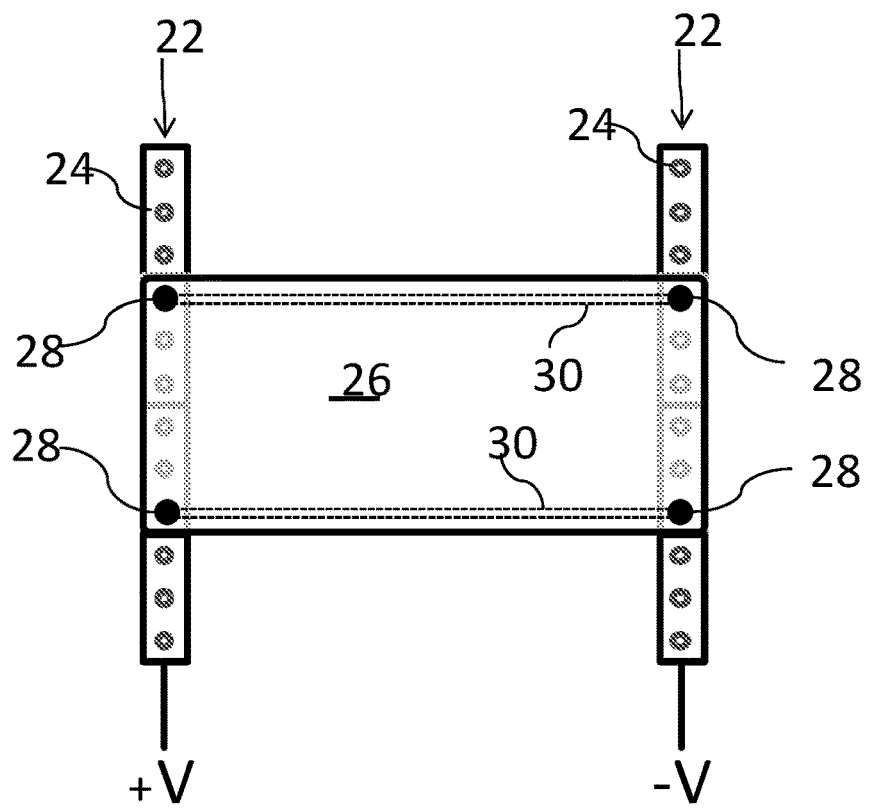
FIG. 5 shows a partial front view of a server rack according to an embodiment of the disclosure.

FIG. 5 shows a partial front view of a server rack according to an embodiment of the disclosure. The U-holes 24 in each rack rail 22 are provided with a low power electrical supply, e.g. held at a low DC voltage, such as 5V, 12V or 20V. For example, one rail could be held at a DC voltage +V and the other at a DC voltage −V. Alternatively, one rail could be grounded and the other maintained at a non-zero DC voltage of ±V. A custom, i.e. non-standard, blanking panel 26 is supplied which includes horizontal electrically conductive strips 30 which, when the blanking panel is fitted, form a conductive connection between a pair of U-holes at the same vertical height. The fitting of the blanking panel therefore serves to "make" a continuity circuit between a pair of U-holes which identifies which height the blanking panel is mounted, specifically in which slot number, e.g. 3U and 4U in the illustrated example of two horizontal strips 30. The removal of a blanking panel would open the make/break circuit and therefore change the status of the rack, which could then trigger an alert message. In the illustrated blanking panel 26, horizontal strips 30 are arranged at the levels of the top and the bottom U-holes of the panel. An embodiment could have one such horizontal conductive strip 30 per slot, e.g. each arranged to align with the top-level U-holes of each slot or one of the other U-holes, e.g. middle or bottom.

Figure 6:
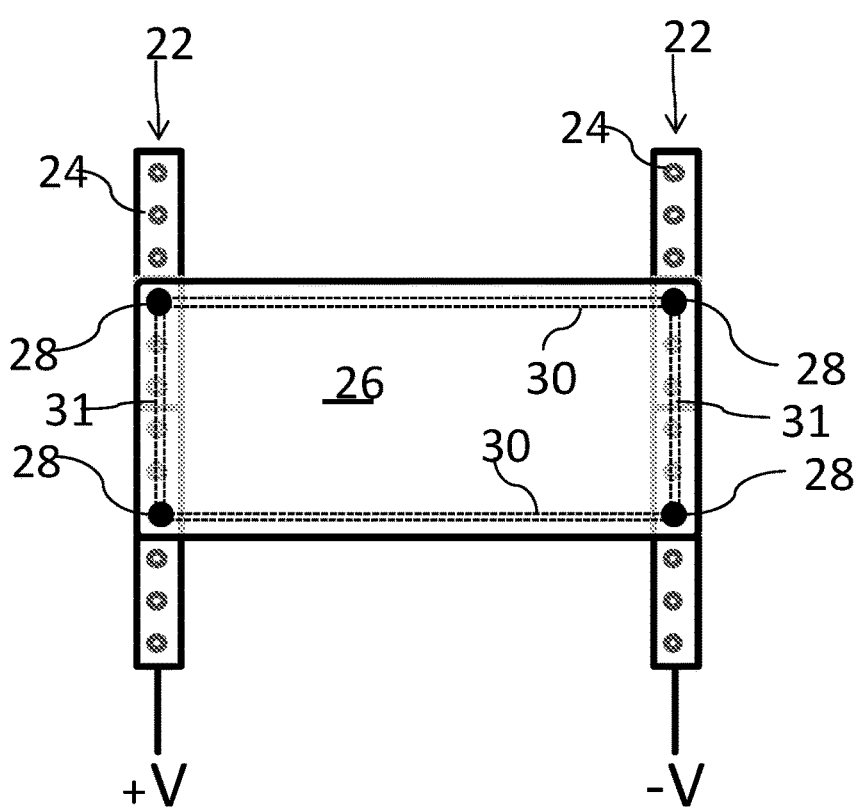
FIG. 6 shows a partial front view of a server rack according to another embodiment.

FIG. 6 shows another embodiment. Compared with the embodiment of FIG. 5, the custom blanking panel 26 is additionally provided with vertical electrically conductive strips 31 which, when the blanking panel is fitted, i.e. when its fastening pins 28 are inserted into the U-holes 24, a conductive connection is formed between a group of four U-holes located at the four corners of the blanking panel 26 where the pins are located. A pin 28 inserted in a U-hole 24 forms a bridge which makes the circuit. The fitting of the blanking panel therefore serves to "make" a continuity circuit between a group of four U-holes. Another embodiment could have only the pair of vertical conductive strips 31, but not the horizontal ones 30. A still further embodiment could have only one such vertical conductive strip 31, e.g. only in the left rail or the right rail. The circuit could be made by conductive connection between the strips 31, the male fasteners 28 used to secure the blanking panel to the U-holes, and the U-holes 24. A reed switch could for example be arranged in or adjacent the U-holes, which is then actuated by insertion of the lugs in the U-holes. Blanking panels could be made with the strips 30/31 inbuilt. It would also be possible to retrofit conductive strips to old panels, e.g. using wire tape. Rack units typically also have electrically conducting metal frames, so would make the continuity circuit in the same way to the blanking panels, so that a system controller could detect slot occupancy by a rack unit in the same way.

Figure 7:
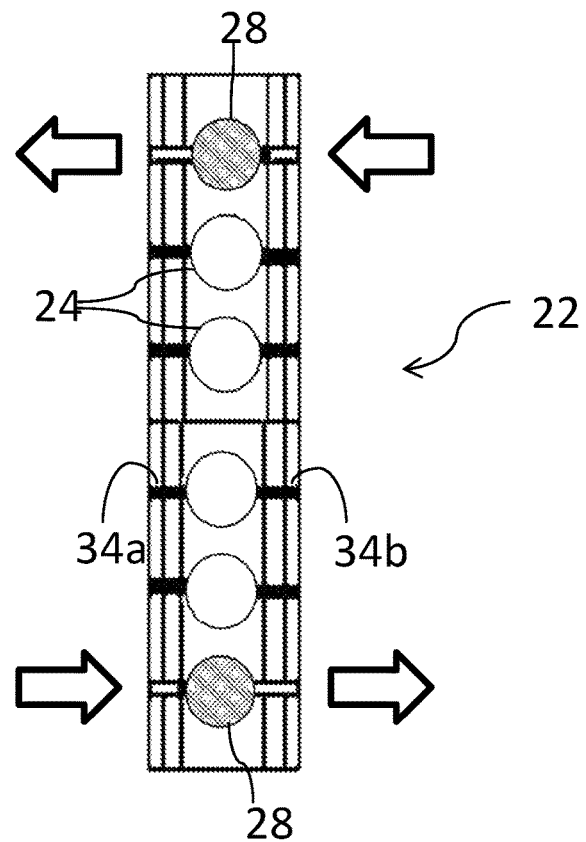
FIG. 7 shows a partial front view of a server rack rail according to a further embodiment.

FIG. 7 shows a partial front view of a single rack rail 22 according to another embodiment. Blanking plate fastening pins (or lugs or studs) 28 are inserted into the top and bottom U-holes 24. The other U-holes 24 are empty. Each U-hole accommodates open circuit ends 34a, 34b of two circuit portions which terminate at different positions on the inner periphery of the U-hole. The circuit portions 34a, 34b are part of a circuit which is normally open circuit when the U-hole is empty, but which is closed by insertion of an electrically conductive fastening pin into the U-hole which bridges across between the ends of the circuit portions 34a, 34b to "make" the connection as schematically illustrated by the arrows. The circuit portions 34a, 34b thus form terminals of a switch element. Alternatively, a pair of circuit portions could be connected or disconnected mechanically by the physical intrusion of a pin in the hole or through to beyond the end of the hole. For example, the terminals could be normally connected and intrusion of a pin in the hole physically displaces one or both of the terminals, or an intermediate body which buts thereon, to cause the terminals to become disconnected. The circuit is powered by an electrical power supply which is present in the server rack, noting that a modern server rack will most probably already have a suitable power supply. The power supply is operable to generate a low voltage to the rails and thus power the make/break circuit, thus enabling the presence and slot locations of fasteners in the holes to be detected. It is possible to use optoelectronic make-and-break switches. In this case, the switch elements each comprise a light source, such as a light emitting diode, and light detector, such as a photodiode detector. These could be arranged on opposite sides of a hole, or below the inward base of the hole, but in any case so that insertion of a blanking plate pin in the hole interrupts to the beam from source to detector either directly or indirectly by actuating some secondary element, such as a spring tab at the base of the hole. The switching state of the make/break circuit will thus correspond to light from the light source being received or not received by the light detector responsive to the presence or absence of a fastening pin in the hole.

Figure 8:
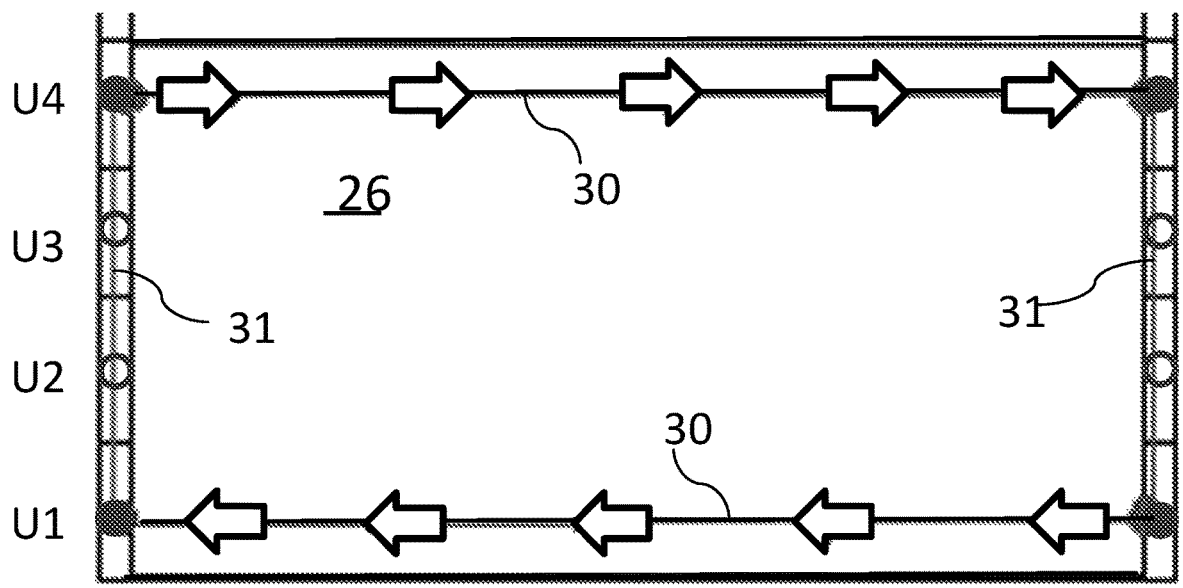
FIG. 8 shows a partial front view of a server rack according to a still further embodiment.

FIG. 8 shows a partial front view of a server rack 20 with fitted 4U blanking panel 26 according to a design which incorporates linked circuits to convey signals (e.g. via a signal overlaid on a power line). A value would be sent through each U-hole and, as one U-hole is electrically connected to another U-hole via the blanking panel, the signal will build. For example, as illustrated schematically with the arrows, starting at U1 with a U1 message, the U1 message is returned at U4 (via the bridging conductive strip 31) and U4 receives the U1 message, and thus it is known from analyzing the messages that there is a bridging connection between U1 and U4.

In the above embodiments, it will be understood that the blanking panel may be formed with apertures, e.g. holes or open slots, in its corners (or elsewhere matched to the U-hole grid), and the blanking panel can then be secured to a slot by inserting fastening pins through the apertures and into a matched set of U-holes. Alternatively, the blanking panel may have fastening pins as part of it, either formed integrally with the main sheet of the panel or attached to the main sheet. All that is important is that there are suitable locations in the blanking panels for the pins, these locations being at positions that are matched to the U-hole grid pattern.

Figure 9:
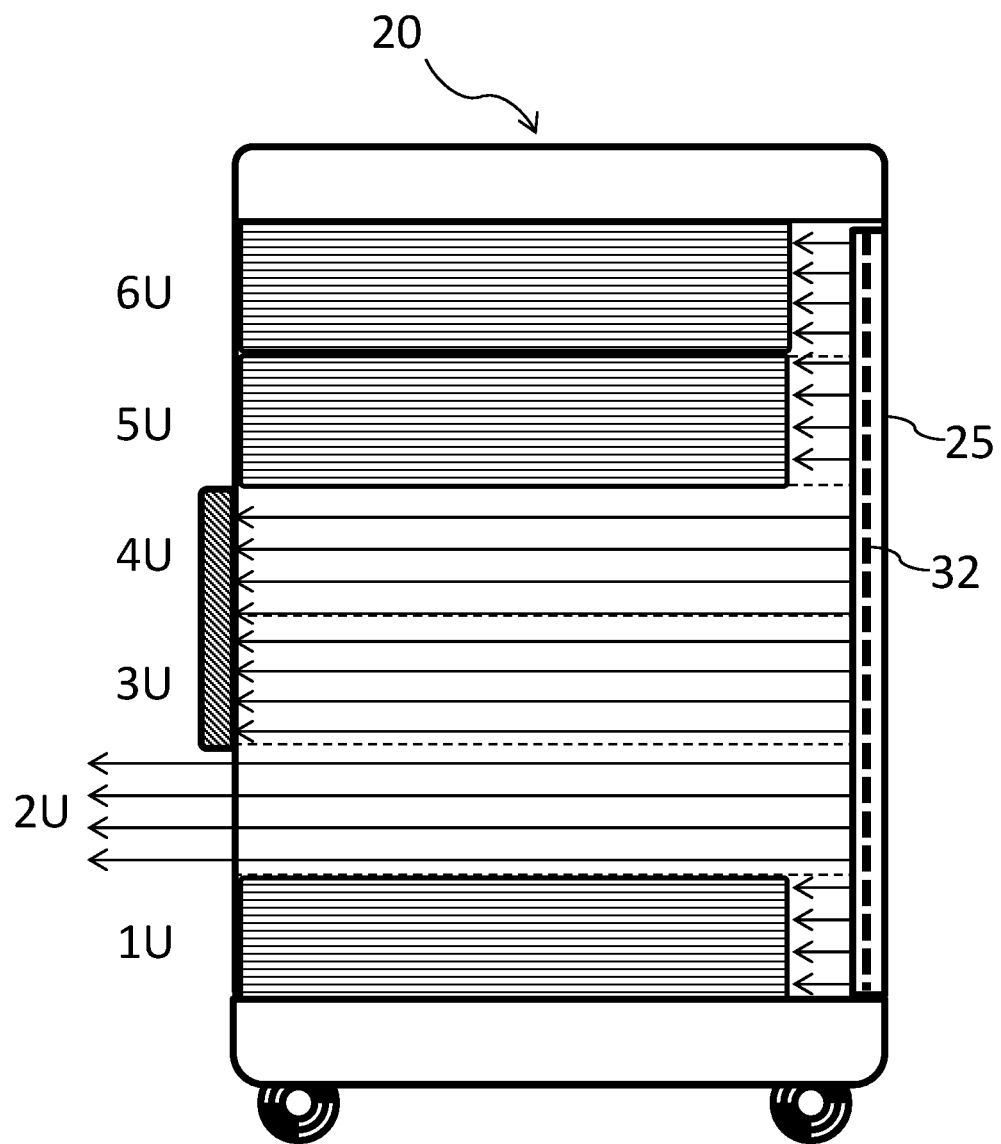
FIG. 9 shows a schematic side view of a server rack according to an alternative embodiment of the disclosure.

FIG. 9 shows a schematic side view of a server rack 20 according to an alternative embodiment of the disclosure which uses optical detection of a missing blanking panel. The rear door 25 is fitted with at least one bank of vertically spaced emitter-detector sensor pairs 32 which are mounted so as to be directed inwards when the door is closed. There may be one sensor for each rack rail hole, corresponding to three per slot in the illustrated embodiments. Preferably however there are at least two sensors per slot. At the very least there should be one sensor per slot. As an alternative to fitting the sensor bank(s) to the rear door, the sensor bank(s) could be fitted to the rack frame somewhere convenient on the rear. Each sensor emitter may output a light beam in the visible or infrared region, for example. The emitters may be light-emitting diodes (LEDs), superluminescent LEDs (SLEDs) or low-power semiconductor diode lasers, for example. The sensor detectors may be suitably compatible semiconductor photodiode detectors, e.g. p-n junction or p-i-n junction detectors. Each sensor 32 is operable to emit a light beam horizontally inwards as shown by the arrows and detect light that is scattered back. Each sensor 32 may be configured individually to be able to filter out its own back scattered light, e.g. by the emitter being driven with a unique drive pulse function which can then be gated or otherwise filtered by the detector. Alternatively, the sensors may collectively be driven in sequence, i.e. in a time multiplexed manner, so that only one sensor is active at a time. Through the strength of the backscattered light, three states can be distinguished, e.g. by thresholding. In a first state, if a slot is occupied (see 1U, 5U, 6U), there will be strong back scatter. In a second state, if a slot is empty and a blanking panel is fitted (see 3U, 4U), then there will be significant back scatter, but much less than if the slot were occupied. In a third state, if a slot is empty and no blanking panel is fitted (see 2U), then there will be no back scatter or only very weak back scatter. Moreover, if the sensor bank is fitted to the rear door 25, then, when the door is open, all sensors will indicate a gap state, so this can be recognized as such, and so used to generate a status of 'rear door open'.

It is noted that in recent times server racks have intelligent power distribution units (PDUs) that are connected to the network of the datacenter. The PDU of a rack can therefore be configured to send status information regarding the rack over the network to an appropriate control entity, such as an SMTP message or email message. The server rack can thus communicate relevant status information regarding the occupation of its slots (filled with rack unit—empty with blanking panel—empty and open). In particular, if a slot is sensed to be empty and open, an alarm or alert can be communicated.

Embodiments of the disclosure can be implemented in new racks at the time of manufacture. Moreover, if an existing rack has an intelligent PDU, this will allow a straightforward retrofit of the rack to adapt it to conform with an embodiment of the disclosure. Even if this is not the case, e.g. for an older rack, a retrofit would nevertheless be possible, for example by fitting a network-enabled wireless communication device to the rack.

In summary, a standard server rack is modified to be able to detect if a blanking panel is missing from an unoccupied slot. Detection can be achieved electrically by providing switch elements in the holes on the rack siderails, whose switching state depends on whether a fastening pin is in its hole. A blanking panel, when fitted to a particular slot, thus switches the switch elements for that slot, which can be detected by a make/break circuit including the switch elements. Alternatively, detection of a missing blanking panel can be achieved optically by arranging a bank of forward pointing optical sensors at the back of the server rack, which point forward to detect the presence of a blanking panel. The optical sensors are distributed vertically so that at least one optical sensor covers each slot.

It will be clear to one skilled in the art that many improvements and modifications can be made to the foregoing exemplary embodiment without departing from the scope of the present disclosure.

What is claimed is:

1. A server rack having a front and a back, the server rack comprising:
   a frame defining a plurality of vertically adjacent slots of standard height and standard width for receiving and accommodating standard-sized rack units having a height equal to an integer multiple of the standard height and the standard width, the frame having on its front left and right siderails which extend vertically and in which are arranged respective series of holes by which a rack unit accommodated in a slot may be secured to the frame with suitable fastening pins; and
   respective switch elements associated with the holes of at least one of the left and right siderails, each switch element being configured to toggle between first and second switching states dependent on the presence or absence of a fastening pin in its hole;
   wherein the frame is configured to form part of a continuity circuit, wherein closing of the continuity circuit to make a connection indicative of presence of a blanking panel requires an electrically conductive path to be externally provided by the blanking panel according to one or more of the following:
   horizontally between two holes at the same height in the left and right siderails;
   vertically between two holes at different heights in the same siderail;
   horizontally between two pairs of holes each pair at the same height in the left and right siderails;
   vertically between two holes at different heights in each of the left and right siderails; and
   in a loop connecting at least three holes including at least one hole from both left and right siderails.

2. The server rack of claim 1, further comprising an electrical power supply operable to generate a low voltage, wherein the switch elements are electrically connected to the power supply so that the server rack is operable to detect presence and slot locations of fastening pins in its holes.

3. The server rack of claim 1, wherein the switch elements each comprise a light source and light detector, where the first and second switching states correspond to light from the light source being received or not received by the light detector responsive to the presence or absence of a fastening pin in the hole.

* * * * *